United States Patent
Page et al.

(12)

(10) Patent No.: US 6,472,291 B1
(45) Date of Patent: Oct. 29, 2002

(54) PLANARIZATION PROCESS TO ACHIEVE IMPROVED UNIFORMITY ACROSS SEMICONDUCTOR WAFERS

(75) Inventors: Joseph E. Page, Mechanicsville, VA (US); Jonathan P. Davis, Glen Allen, VA (US); Scott W. Bailey, Chester, VA (US)

(73) Assignees: Infineon Technologies North America Corp., San Jose, CA (US); Infineon Technologies Richmond, LP, Sandston, VA (US); Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/492,541

(22) Filed: Jan. 27, 2000

(51) Int. Cl.[7] .................. H01L 21/76; H01L 21/302; H01L 21/461

(52) U.S. Cl. .................. 438/424; 438/435; 438/692; 438/693

(58) Field of Search .................. 438/424, 435, 438/691, 692, 693

(56) References Cited

U.S. PATENT DOCUMENTS

| | | | |
|---|---|---|---|
| 5,212,114 A | 5/1993 | Grewal et al. | 437/192 |
| 5,643,823 A | 7/1997 | Ho et al. | 437/67 |
| 5,747,866 A | 5/1998 | Ho et al. | 257/506 |
| 5,763,315 A | 6/1998 | Benedict et al. | 438/424 |
| 5,804,490 A | 9/1998 | Fiegl et al. | 438/424 |
| 5,851,899 A | 12/1998 | Weigand | 438/427 |
| 5,854,126 A | 12/1998 | Tobben et al. | 438/626 |
| 5,880,007 A | 3/1999 | Varian et al. | 438/427 |
| 5,923,993 A * | 7/1999 | Sahota | 438/427 |
| 6,037,237 A * | 3/2000 | Park et al. | 438/424 |
| 6,090,714 A * | 7/2000 | Jang et al. | 438/692 |
| 6,180,525 B1 * | 1/2001 | Morgan | 438/692 |
| 6,197,660 B1 * | 3/2001 | Jang et al. | 438/427 |
| 6,261,957 B1 * | 7/2001 | Jang et al. | 438/692 |

* cited by examiner

Primary Examiner—John F. Niebling
Assistant Examiner—Ron Pompey
(74) Attorney, Agent, or Firm—Stanton Braden

(57) ABSTRACT

A method for planarizing a dielectric layer on a semiconductor wafer while eliminating a mask and etch step, in accordance with the present invention includes providing a semiconductor wafer having trenches formed in a trench region of a substrate, and forming a dielectric layer on the semiconductor wafer to fill the trenches whereby up features form on flat surfaces of the wafer. An edge portion of the semiconductor wafer is polished to remove a portion of the dielectric layer about the edge portions of the semiconductor wafer. The dielectric layer is polished across the entire semiconductor wafer by employing a single non-stacked polishing pad and a slurry to planarize the trench regions and the up features in a single polish step such that a mask step and etch step for reducing the up features are eliminated from the polishing process.

21 Claims, 9 Drawing Sheets

PLANARIZATION PROCESS TO ACHIEVE IMPROVED UNIFORMITY ACROSS SEMICONDUCTOR WAFERS

BACKGROUND

1. Technical Field

This disclosure relates to semiconductor fabrication and more particularly, to a method for planarization of deposited films in a single process step.

2. Description of the Related Art

Semiconductor devices are fabricated by processing layers of materials deposited on a surface of a substrate. One such process includes planarizing a top surface to remove, flatten or smooth the top surface. Planarization techniques are not always uniform across a top surface of a wafer, however, and often depend on the type and density of devices already formed below the layer to be planarized. To attempt to make the planarization process more uniform, preprocessing steps may be employed. In one case, a mask process and an etching process are employed to remove material in selected areas to provide a more uniform layer to be planarized. For example, one method for forming isolation regions includes a deposition of an oxide for a void free fill, a masking and etch step to assist planarization by reducing the oxide over large features and a film removal and planarization by means of a chemical mechanical polish.

One problem with a mask and etch process is that the mask process is typically very expensive. An etch mask must be developed which includes regions which need to be etched and regions which are not be etched. The masking steps, lithographic steps and the etching steps require process time and materials. This makes the preprocessing needed to assist planarization less attractive, especially in sub 0.25 micron technology. However, the elimination of the masking step is generally considered not possible when employing high density plasma deposited films with current chemical-mechanical polishing (CMP) consumables because improved planarization is at the expense of global uniformity.

Therefore, a need exists for a method of depositing and planarizing a dielectric layer with improved global uniformity without the need for preprocessing, such as, for example, masking and etching the dielectric layer before planarization.

SUMMARY OF THE INVENTION

A method for planarizing a dielectric layer on a semiconductor wafer while eliminating a mask and etch step, in accordance with the present invention, includes providing a semiconductor wafer having trenches formed in a trench region of a substrate, and forming a dielectric layer on the semiconductor wafer to fill the trenches whereby up features form on flat surfaces of the wafer. An edge portion of the semiconductor wafer is polished to remove a portion of the dielectric layer about edge portions of the semiconductor wafer. The dielectric layer is polished across the entire semiconductor wafer by employing a single non-stacked polishing pad and a slurry to planarize the trench regions and the up features in a single polish step such that a mask step and etch step for reducing the up features are eliminated from the polishing process.

Another method for planarizing a dielectric layer on a semiconductor wafer while eliminating a mask and etch step, in accordance with the present invention, includes providing a semiconductor wafer having first areas and second areas. The first areas include trenches formed in a substrate of the semiconductor wafer. By depositing and sputtering on a dielectric layer on the semiconductor wafer, the trenches are filled and up features form in the second areas. The sputtering of the dielectric layer is adjusted after the trenches are filled to provide uniformity between a height of the dielectric layer in the first areas and a height of the dielectric layer in the second areas. An edge portion of the semiconductor wafer is polished to remove a portion of the dielectric layer by exerting a bias force against edge portions of the wafer during polishing. The polishing is performed by a single non-stacked polishing pad and a slurry. The dielectric layer is polished across the entire semiconductor wafer by employing the single non-stacked polishing pad and the slurry to planarize the dielectric layer in the first areas and the second areas wherein a mask step and etch step are eliminated from the polishing process.

Yet another method for planarizing a dielectric layer on a semiconductor wafer while eliminating a mask and etch step, in accordance with the present invention, includes providing a semiconductor wafer having an array area including trenches formed in a substrate of the semiconductor wafer and depositing and sputtering on a first oxide layer on the semiconductor wafer to fill the trenches to form trench isolation regions. By depositing and sputtering a second oxide layer on the first dielectric layer at a different bias power than the first oxide layer, a combined height of the first oxide layer and the second oxide layer over the array region is brought closer to a combined height of the first oxide layer and the second oxide layer over up features. An edge portion of the semiconductor wafer is polished to remove a portion of the first and second oxide layers by exerting a bias force against edge portions of the wafer during polishing. The polishing is performed by a single non-stacked polishing pad and a slurry. The dielectric layer is polished across the entire semiconductor wafer by employing the single non-stacked polishing pad and the slurry to planarize the first and second oxide layers wherein a mask step and etch step are eliminated from the polishing process.

In other methods, the step of polishing an edge portion may include the step of exerting a bias force against edge portions of the wafer with a polishing pad during polishing. The polishing pad may include a urethane polishing pad. The step of forming a dielectric layer may include the steps of depositing and sputtering on the dielectric layer to provide a void-free trench fill. The slurry may include a fumed silica particle slurry. The step of forming a dielectric layer may include the step of depositing an oxide layer. The step of forming a dielectric layer may include the step of forming two dielectric layers to reduce a volume difference of the dielectric layer between the trench regions and the flat features by biasing a deposition process for at least one of the two layers. The method may include the step of adjusting the polish rate of the two dielectric layers. The step of depositing a dielectric layer may include the step of depositing an oxide layer by employing a high-density plasma (HDP) deposition.

In still other methods, the step of depositing the first oxide layer and/or the second oxide layer may include the step of depositing the first oxide layer by a high-density plasma (HDP) process. The method may include the step of adjusting the polish rate of the first and second oxide layers. The bias power is preferably higher for the first oxide layer than the bias power for the second oxide layer.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides methods for semiconductor fabrication and more particularly methods for planarizing dielectric layers in a single step. The present invention includes new and useful method steps for polishing and deposition, which permit the formation of structures, such as, for example, isolation regions without a mask and etch step. This provides many advantages including time and cost savings.

In one particularly useful embodiment, a method to form a shallow trench isolation in sub 0.25 micron deposited films or layers includes modulation of the deposition to sputter ratio of a shallow trench isolation oxide fill such that volume of oxide in the array regions is increased and polishing rate of oxide in the array regions is decreased. This embodiment provides for modulation of global uniformity of the wafer's polishing rate such that polishing is performed on a hard urethane pad, or equivalent, affixed directly to a rigid polishing table. The modulation of uniformity can be accomplished by applying pressure to the wafer perimeter through a contact point(s) on the back of the wafer by shaping a carrier, carrier film, or application of force through a plate designed for de-chucking. Chemical mechanical polishing is then preferably performed on the wafer with a fumed silica slurry. Other embodiments will described in greater detail below. The present method will be illustratively described in terms of trench isolation regions formed in a substrate. The invention is not to be construed as limited by this illustrative example, however.

Figure 1:
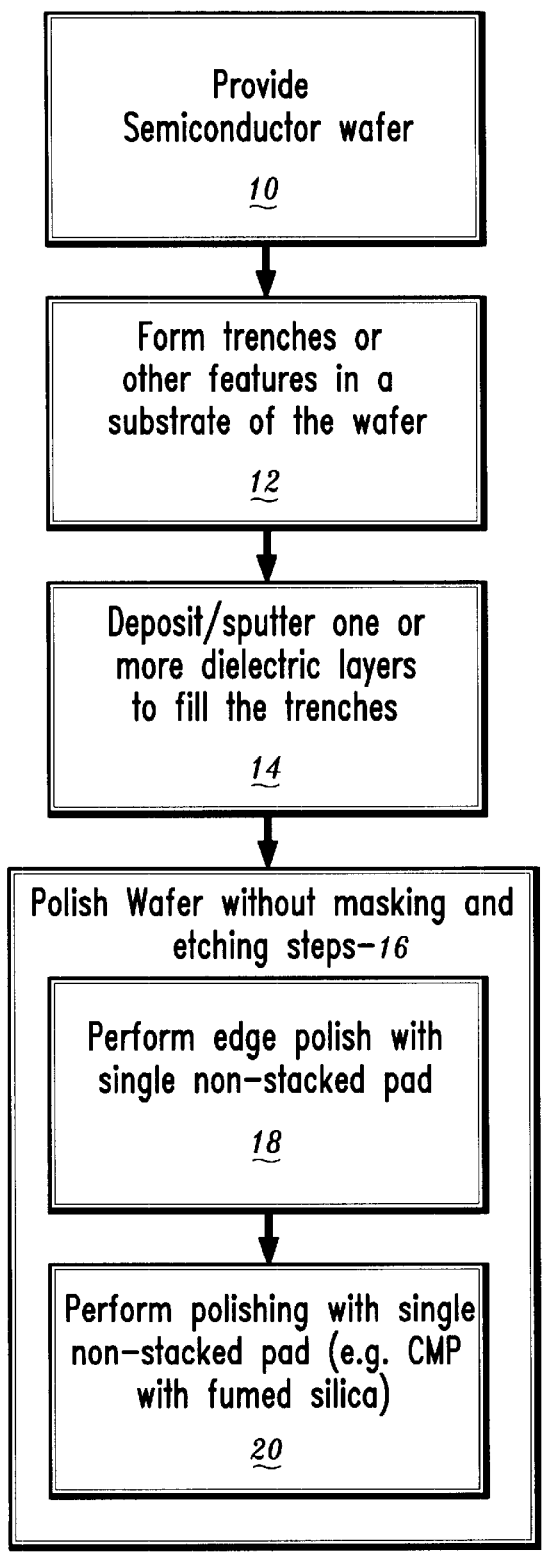
FIG. 1 is a flow diagram showing a method for planarizing a wafer without a mask and etch step in accordance with the present invention.
Figure 2:
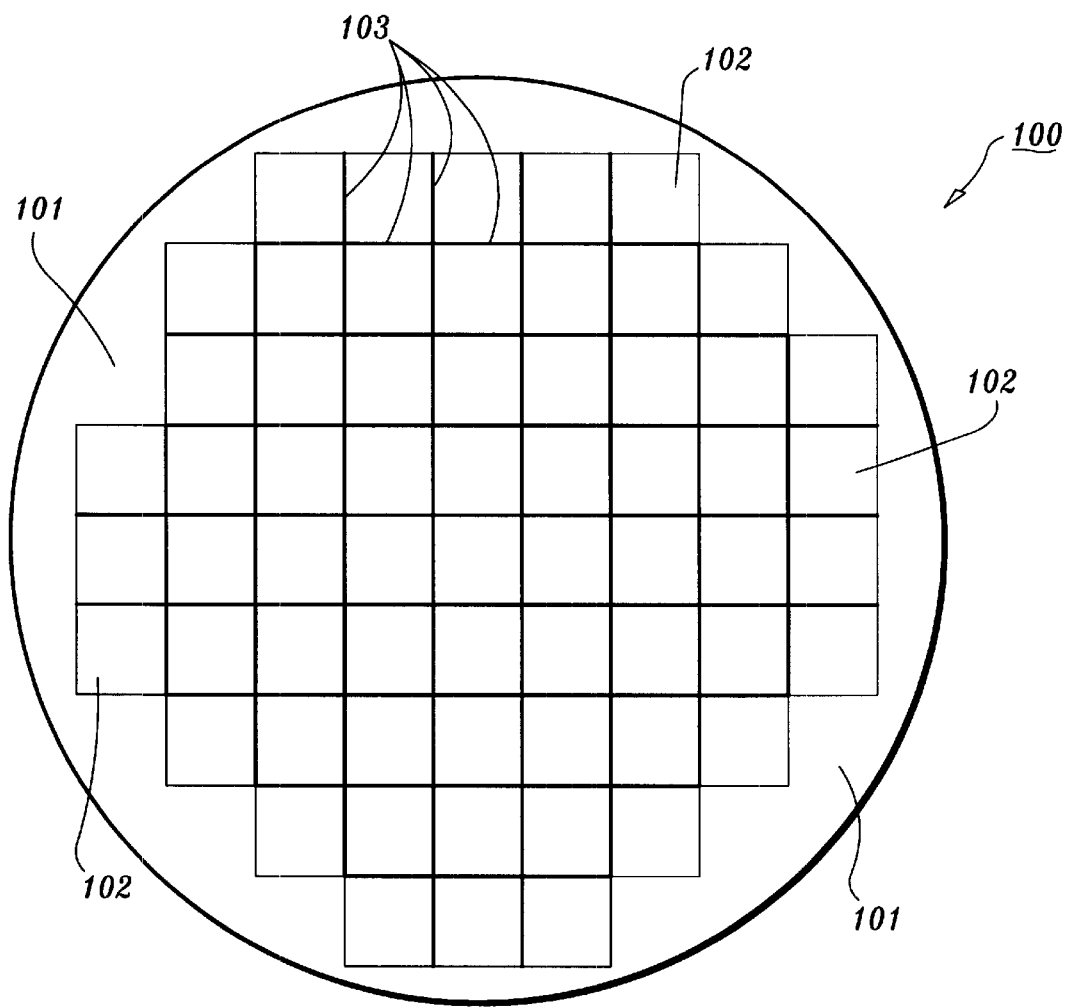
FIG. 2 is a top view of a semiconductor wafer which may be planarized in accordance with the present invention.

Referring now in specific detail to the drawings in which like reference numerals identify similar or identical elements throughout the several views, and initially to FIG. 1, a flow diagram for a method of depositing and planarizing a dielectric layer in accordance with the present invention is shown. In block 10, a semiconductor wafer 100 (FIG. 2) is provided. A semiconductor wafer 100, as shown in FIG. 2, may include chips 102, for example, semiconductor memory devices, such as dynamic or static random access memories, application specific integrated circuits (ASICs), logic chips or any other semiconductor chip. Wafer 100 includes areas 101 which do not include chips due to their proximity to the edge of wafer 100. Wafer 100 is preferably formed from a monocrystalline silicon.

Figure 3:
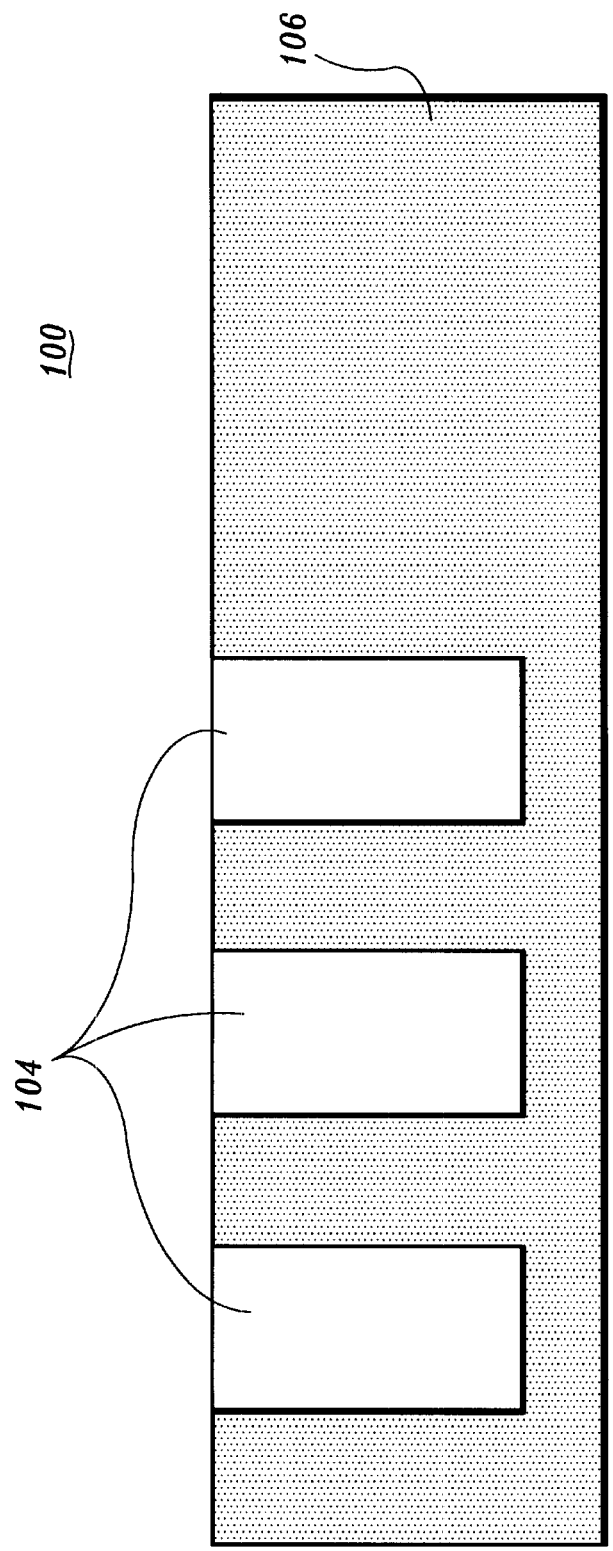
FIG. 3 is a cross-sectional view of a substrate showing trenches formed therein in accordance with the present invention.

Referring to FIGS. 1 and 3, in block 12 (FIG. 1), wafer 100 is processed to form surface features, such as, trenches 104 in a substrate 106 by employing conventional etching techniques. Trenches 104 may be formed by employing a hard mask (not shown) and anisotropic dry etching, e.g., reactive ion etching, substrate 106 in accordance with the hard mask. In block 12, trenches 104 are formed for isolation regions, such as shallow trench isolation regions employed for isolating devices formed in or on substrate 106.

Figure 4:
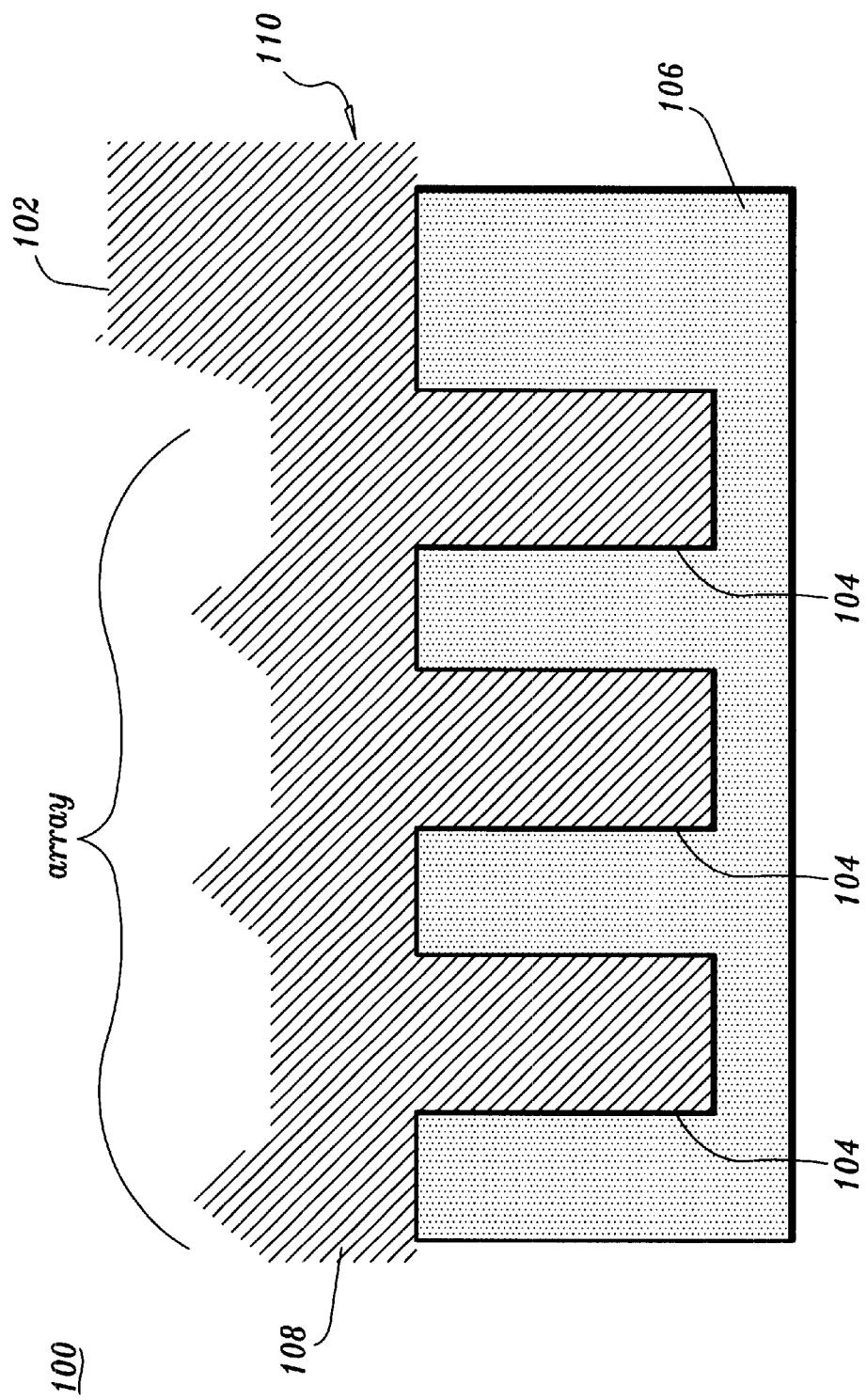
FIG. 4 is a cross-sectional view of the substrate of FIG. 3 showing trenches filled with a dielectric layer in accordance with the present invention.
Figure 5:
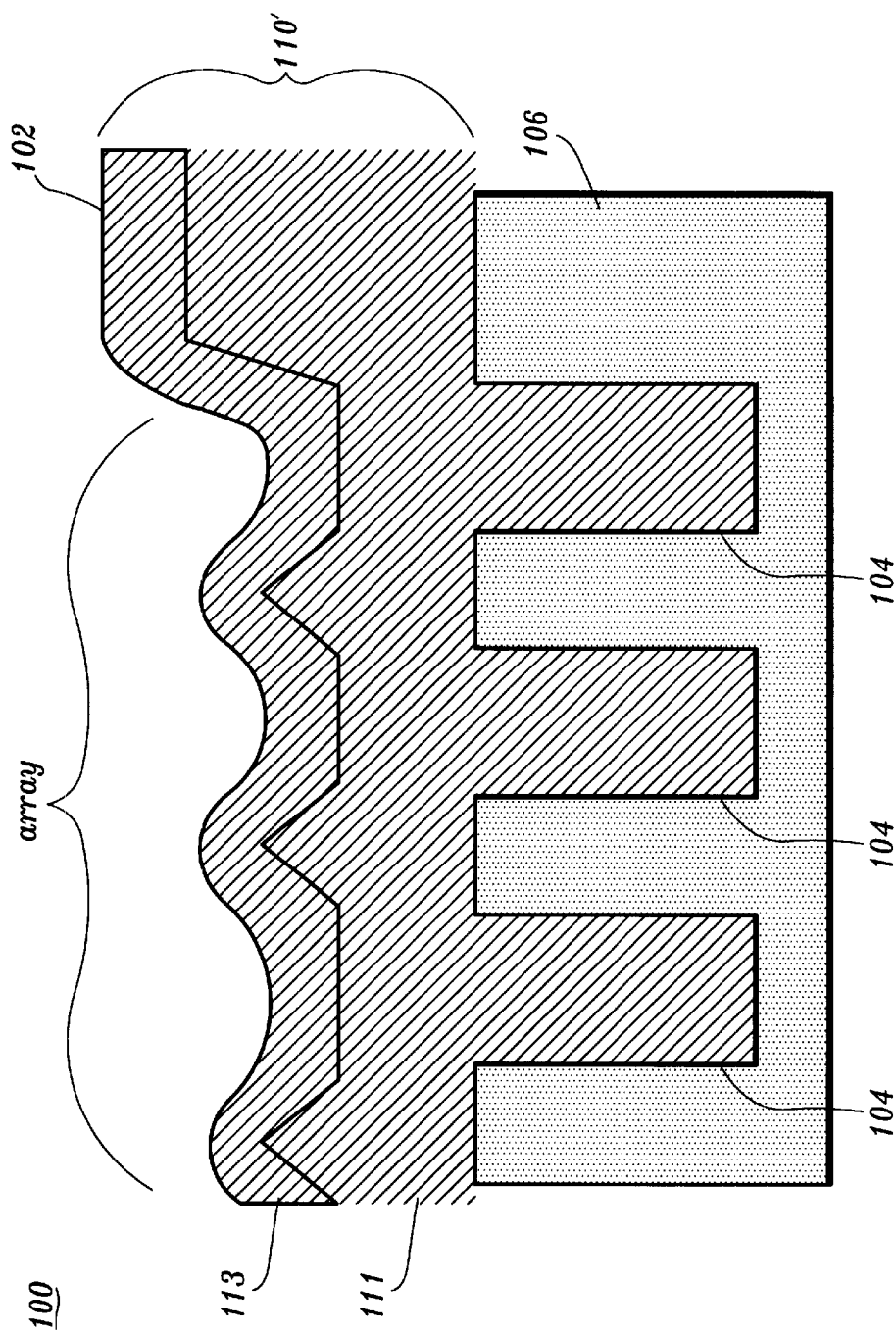
FIG. 5 is a cross-sectional view of the substrate of FIG. 3 showing two dielectric layers having different polish rates formed thereon in accordance with the present invention.

In block 14, isolation regions are formed by depositing a dielectric material 108 (see FIGS. 4 and 5). Dielectric material 108 preferably includes an oxide and more preferably a high density oxide. The high density oxide may be formed by employing a high density plasma deposition process. In one embodiment, shallow trench isolation regions are formed by filling trenches 104 with dielectric material 108. It should be noted that upper surfaces of substrate 106 may be covered by layers (not shown), such as a pad oxide layer or pad nitride layer or other dielectric for patterning or processing device 100.

In one preferred embodiment, as shown in FIG. 4, dielectric material 108 forms a dielectric layer 110. For a semiconductor memory employing shallow trench isolation regions in a memory array, dielectric layer 110 is modulated such that the volume (e.g., thickness) of dielectric material 108 (e.g., oxide) in the array regions is increased for trench fill. A deposition to sputter ratio is modulated to first provide a void free trench fill (e.g., more sputtering) and then modulated to decrease volume in the array areas (e.g., less sputtering). This establishes more uniformity in polishing due to the volume difference being reduced between array and non-array regions. Advantageously, this modulation is performed during the deposition of dielectric material 108. In one preferred embodiment, the deposition of dielectric material 108 is performed in layers to adjust the polishing rate as will be described below. The deposition may include high-density plasma (HDP) deposition.

Referring to FIG. 5, to achieve a more uniform planarized surface for wafer 100, a multiple layer film 110' may be formed. Film 110' includes at least two layers 111 and 113 which may be deposited by employing a high density plasma (HDP) deposition which alters the volume and polish rate of the oxide deposited over the array. The HDP process takes advantage of concurrent deposition and sputter, whereby at geometric corners a sputter rate is much faster than on flat features.

This corner sputtering prevents the film from pinching off deposition in very tight spaces, creating a very high quality, void free film. Due to this process, however, very large differences in oxide volume exist in array areas compared to large, unetched "up-features" areas 102 in FIGS. 4 and 5. Up features 102 are formed in areas adjacent to arrays or in areas where large flat features occur. For example, the large up features include scribe lines or kerfs 103 between chips 102 (see FIG. 2).

Dielectric layer 110' with layers 111 and 113 is advantageously provided to improve array protection during the polishing steps as described below. A radio frequency bias is applied through the wafer's pedestal during deposition in a plasma chamber which affects the sputter rate at corners of trenches 104 in substrate 106 and hence the ratio of oxide volume in dense areas compared to the oxide volume in large up features. By depositing two layers, the first layer (layer 111) at a higher bias for a void free fill, and the second layer (layer 113) at a low or no bias, the ratio of oxide volume of the dense to large up features can be modulated. Advantageously, the low or no bias layers include a lower volume of material than the high bias layers' volume. Tailoring or adjusting the deposition process to provide a low or no bias layer, which fills the top part of the trench provides for additional array protection. The volume difference between up features and a top surface of dielectric material in the array regions is closer thereby reducing the risk of over polishing the array regions. Layers 111 and 113 may include different polishing rates as well. For example, layer 113 may provide a slower polishing rate than layer 111.

In one embodiment, high-density plasma deposition/sputtering is employed to deposit layer 111 with a thickness of about 3200 Å and layer 113 with a thickness of about 1500 Å to achieve a better height uniformity. The better height uniformity includes an improvement of at least 25% over the prior art between the height of up features and the array. In another embodiment, layer 111 is deposited with a bias of between about 2500 W and about 2700 W and layer 113 is deposited with a bias of between about 900 W and about 1100 W. The polishing is preferably performed under the following conditions with fumed silica particles: 60 to 120 RPMS for the platen, at 3 to 6 psi, and pressure, 60 to 120 RPMS for the carrier.

Figure 6:
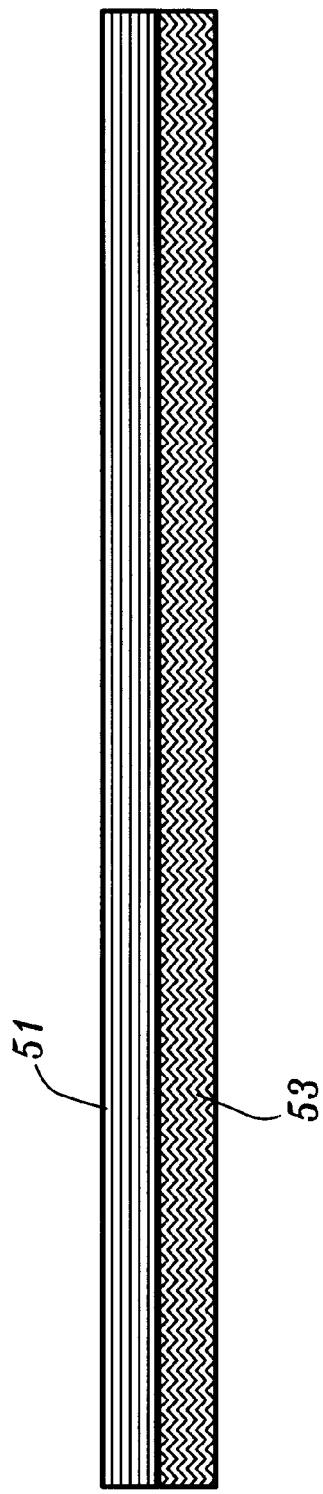
FIG. 6 is a cross-sectional view of a conventional polish pad.
Figure 7:
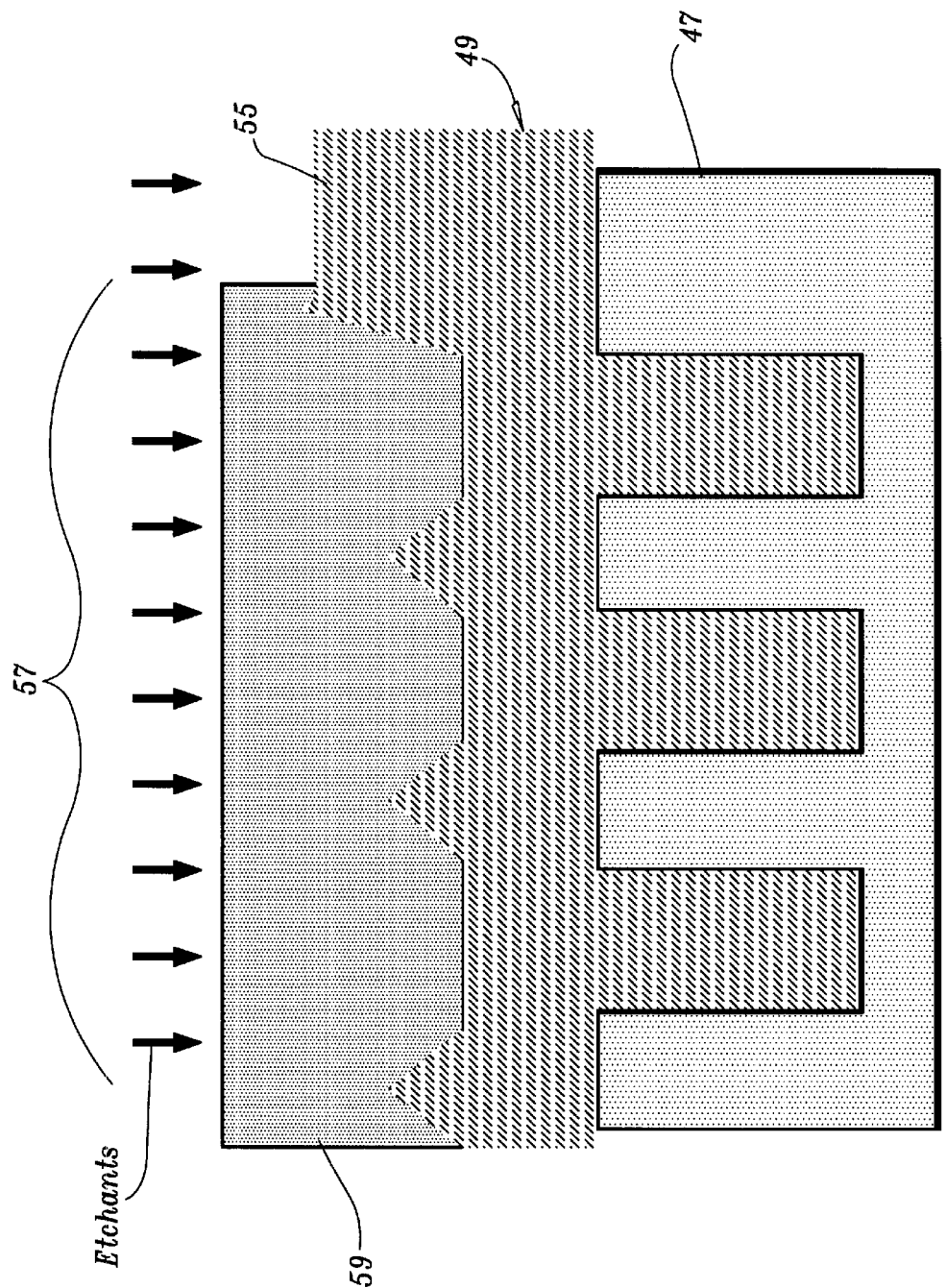
FIG. 7 is a cross-sectional view of a substrate having a dielectric layer formed thereon which includes a mask for etching up features in accordance with the prior art.
Figure 8:
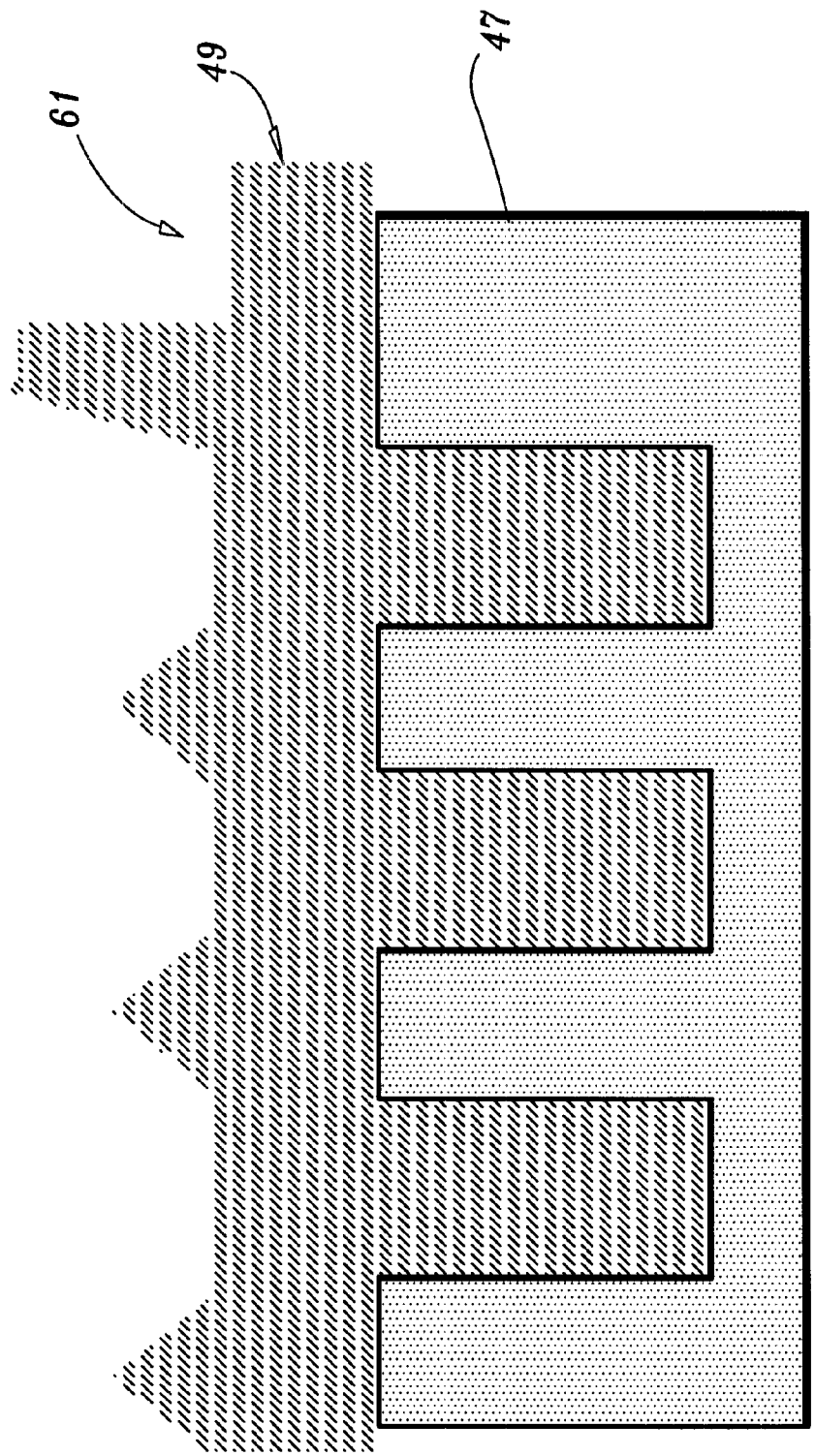
FIG. 8 is a cross-sectional view of the substrate of FIG. 7 after etching in accordance with the prior art.

In conventional polishing processes, CMP employs a hard urethane pad 51 stacked on top of a soft pad 53 (felt pad), as shown in FIG. 6. The top pad 51 is for planarization, and the bottom pad 53 is for uniformity. The soft bottom pad 53 (felt) is a required to meet uniformity concerns. However, using the soft pad actually decreases planarization. This is in part due to the inability of removing all oxide from the large flat up features 55 without over polishing an array or dense areas 57, as illustratively shown in FIG. 7. Up features 55 occur at transition locations in a dielectric layer 49 over the surface of a substrate 47. The current art employs a mask 59 and etch step to reduce the oxide thickness or volume in the large up feature areas 61 such that chemical mechanical polish is possible, as shown in FIG. 8. See U.S. Pat. No. 5,880,077, incorporated herein by reference.

In accordance with the invention, the mask and etch steps are eliminated while improving global uniformity of dielectric layer 110. In block 16 of FIG. 1, global uniformity of the wafer's polishing rate is provided. One way of providing this polishing rate uniformity includes the following.

In block 18, edge polishing is performed to compensate for non-uniform polishing which may occur due to single pad polishing which follows. This is performed by providing an illustrative setup as shown in FIG. 9.

Figure 9:
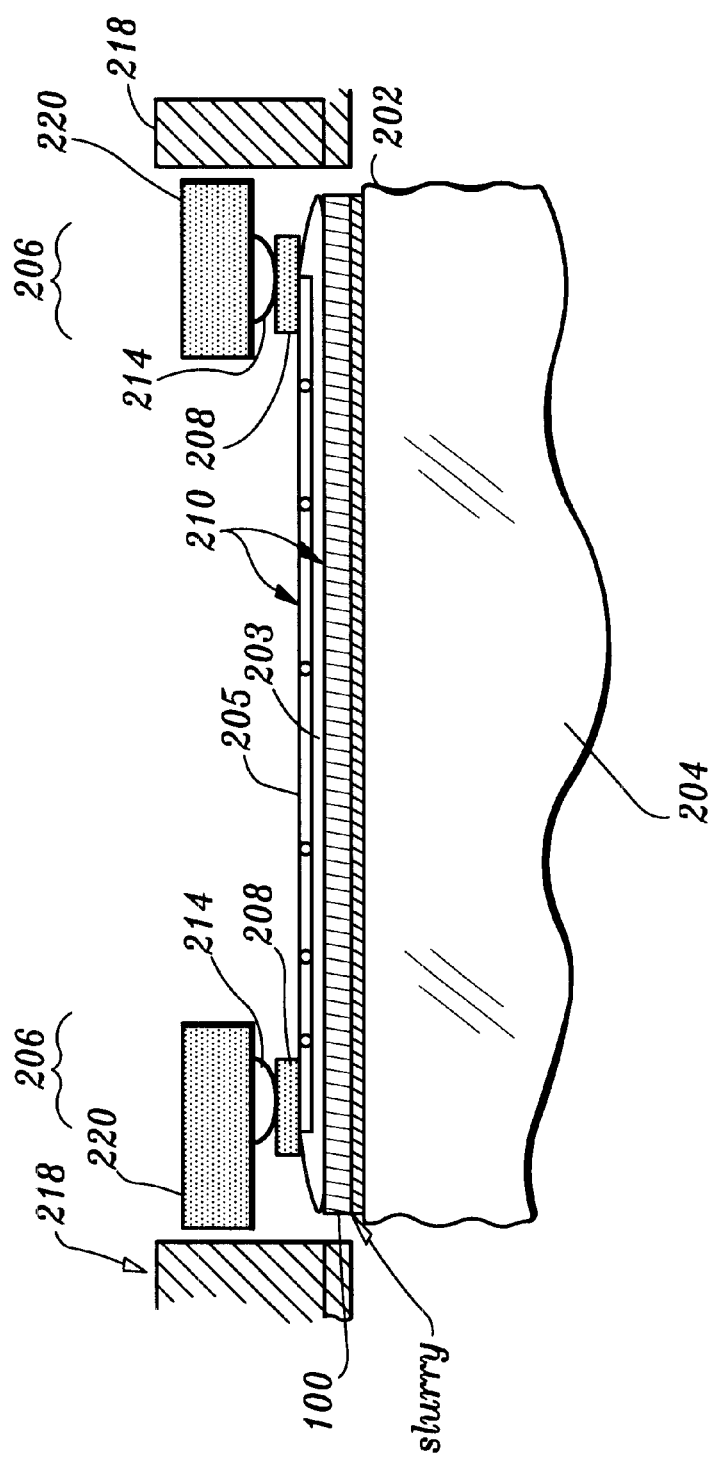
FIG. 9 is a cross-sectional view of a polishing head apparatus showing edge polishing in accordance with the present invention.

Referring to FIG. 9, in one embodiment, edge polishing is performed to compensate for non-uniform polishing which may occur due to a single non-stacked pad 202. Pad 202 may be provided with a wear-resistant surface or a wear-resistant material, such as urethane, for example. Pad 202 is preferably affixed directly to a polishing table 204, and the modulation of uniformity can be accomplished by applying pressure to a wafer perimeter 206 through a contact point or points 208 on the back of wafer 100.

Edge polishing is performed since a single hard pad may leave an unpolished region near the edge portions of a wafer. Edge polishing is preferably performed for a distance of between about 3 mm and 20 mm from the edge portions of wafer 100.

Contact with wafer 100 may be provided by shaping an interface 210, which may include a carrier, a carrier film, or other application of force to an edge portion of a wafer. Interface 210 includes a polishing membrane 203 for coupling wafer to interface 210.

An inner tube 214 may be included to perform the edge polish step of block 16 (FIG. 1). Inner tube 214 includes an elastic material which applies a force to contact points 208 and is utilized to improve the edge polish rate. Retaining rings 218 are employed to envelop wafer 100 to retain its position during polishing. Plates 220 support inner tube 214. In one embodiment, inner tube 214 is inflatable for applying a greater force against wafer 100. In this head design, inner tube 214 is used for de-chucking (i.e., to lift) wafer 100 from the polish pad 202. By pressing onto wafer 100 through a plate 205 which is preferably perforated, inner tube 214 can also affect the edge polishing by increasing the etch rate locally at the edge portions of wafer 100.

Wafer 100 is edge polished to remove material at the edge portions of wafer 100. By utilizing an edge polish step in block 18, sufficient uniformity can be gained to allow polishing with the single non-stacked pad 202.

In block 20, a polishing step such as a chemical mechanical polishing (CMP) is performed. The edge polish step of block 18 permits the use of a single pad, e.g., IC1000 pad in block 20. In block 20, a single non-stacked hard pad 202 is used to further polish a top surface of wafer 100. Pad 202 is employed without continued edge bias which was provided during the edge polish. Pad 202 may be provided with a wear-resistant surface or a wear-resistant material, such as urethane, for example. In a preferred embodiment, pad is employed together with a fumed silica slurry to planarize dielectric layer 110 sufficiently to remove all oxide over the large up features without severely over polishing the array. A preferred fumed silica slurry may include D7000 available commercially from Cabot, Inc. In another preferred embodiment, pad 202 includes a single (non-stacked) IC1000 pad, available from Rodel, Inc. No soft pad is needed. A solo IC1000 pad combined with fumed silica slurry provides sufficient planarization to remove oxide from large features without the need for a mask and etch step.

In combination, the steps of the present invention permit fabrication without a masking and etch step. Some of the features of a preferred embodiment of the present invention include:

1) Use an edge polishing step prior at CMP such that global uniformity is acceptable without using the soft felt under pad. This permits the use of a hard urethane pad directly on the table surface, dramatically improving planarization.

2) Use a fumed silica particle as opposed to a colloidal silica, to further enhance planarization.

3) Utilize a multiple layer HDP deposition to increase the oxide volume in the array.

By the present invention, costs saving of $20 or more per wafer are achieved as well as processing time for mask and etch steps, which could equal a savings of three or more days of cycle time for fabrication.

Having described preferred embodiments for a planarization process to achieve improved uniformity across semiconductor wafers (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims.

Having thus described the invention with the details and particularity required by the patent laws, what is claimed and desired protected by Letters Patent is set forth in the appended claims.

What is claimed is:

1. A method for planarizing a dielectric layer on a semiconductor wafer while eliminating a mask step and an etch step, comprising the steps of:

providing a semiconductor wafer having trenches formed in a trench region of a substrate;

forming two dielectric layers on the semiconductor wafer to fill the trenches and form up features on flat surfaces of the wafer, wherein a volume difference between the dielectric layer in the trench regions and the dielectric layer on the flat features is reduced by biasing a deposition process for at least one of the two layers;

polishing an edge portion of the semiconductor wafer to remove a portion of the dielectric layer about the edge portions of the semiconductor wafer; and polishing the dielectric layer across the entire semiconductor wafer by employing a single non-stacked polishing pad and a slurry to planarize the dielectric layer for trench regions and for the up features in a single step such that a mask step and an etch step for reducing the up features are eliminated from the polishing step wherein the polishing is performed down to an etch stop layer.

2. The method as recited in claim 1, wherein the step of polishing an edge portion includes the step of exerting a bias force against edge portions of the wafer with a polishing pad during polishing.

3. The method as recited in claim 2, wherein the polishing pad includes a urethane polishing pad.

4. The method as recited in claim 1, wherein the step of forming includes the steps of depositing and sputtering on the dielectric layer to provide a void-free trench fill.

5. The method as recited in claim 1, wherein the slurry includes a fumed silica particle slurry.

6. The method as recited in claim 1, wherein the step of forming a dielectric layer includes the step of depositing an oxide layer.

7. The method as recited in claim 6, further comprising the step of adjusting the polish rate of the two dielectric layers.

8. The method as recited in claim 1, wherein the step of depositing a dielectric layer includes the step of depositing an oxide layer by employing a high density plasma (HDP) deposition.

9. A method for planarizing a dielectric layer on a semiconductor wafer while eliminating a mask and an etch step, comprising the steps of:

providing a semiconductor wafer having first areas and second areas, the first areas including trenches formed in a substrate of the semiconductor wafer;

depositing and sputtering on two dielectric layers on the semiconductor wafer to fill the trenches whereby up features form in the second areas, wherein a volume difference of dielectric material between the first areas and the second areas is reduced by biasing a deposition process for at least one of the two layers;

adjusting the sputtering of the dielectric layer after the trenches are filled to provide uniformity between a height of the dielectric layer in the first areas and a height of the dielectric layer in the second areas;

polishing an edge portion of the semiconductor wafer to remove a portion of the dielectric layer by exerting a bias force against the edge portions of the wafer during polishing; and polishing the dielectric layer across the entire semiconductor wafer by employing a single non-stacked polishing pad and a slurry to planarize the first areas and the second areas wherein a mask step and an etch step are eliminated from the polishing step wherein the polishing is performed down to an etch stop layer.

10. The method as recited in claim 9, wherein the single non-stacked polishing includes a urethane polishing pad.

11. The method as recited in claim 9, wherein the slurry includes a fumed silica particle slurry.

12. The method as recited in claim 9, wherein the step of depositing and sputtering a dielectric layer includes the step of depositing and sputtering on an oxide layer.

13. The method as recited in claim 12, further comprising the step of adjusting the polish rate of the two dielectric layers.

14. The method as recited in claim 9, wherein the step of depositing a dielectric layer includes the step of depositing an oxide layer by employing a high density plasma (HDP) deposition.

15. A method for planarizing a dielectric layer on a semiconductor wafer while eliminating a mask and etch step, comprising the steps of:

providing a semiconductor wafer having an array area including trenches formed in a substrate of the semiconductor wafer;

depositing and sputtering on a first oxide layer on the semiconductor wafer to fill the trenches to form trench isolation regions;

depositing and sputtering a second oxide layer on the first dielectric layer at a different bias power than the first oxide layer to bring a combined height of the first oxide layer and the second oxide layer over the array region closer to a combined height of the first oxide layer and the second oxide layer for up features;

polishing an edge portion of the semiconductor wafer to remove a portion of the first and second oxide layers by exerting a bias force against the edge portions of the wafer during polishing; and polishing the dielectric layer across the entire semiconductor wafer by employing a single non-stacked polishing pad and a slurry to planarize the first and second oxide layers wherein a mask step and etch step are eliminated from the polishing process wherein the polishing is performed down to and etch stop layer.

16. The method as recited in claim 15, wherein the single non-stacked polishing includes a urethane polishing pad.

17. The method as recited in claim 15, wherein the slurry includes a fumed silica particle slurry.

18. The method as recited in claim 15, wherein the step of depositing the first oxide layer includes the step of depositing the first oxide layer by a high density plasma (HDP) process.

19. The method as recited in claim 15, wherein the step of depositing the second oxide layer includes the step of depositing the first oxide layer by a high density plasma (HDP) process.

20. The method as recited in claim 15, further comprising the step of adjusting the polish rate of the first and second oxide layers.

21. The method as recited in claim 15, wherein the bias power is higher for the first oxide layer than the bias power for the second oxide layer.

* * * * *